United States Patent
Alhussien et al.

(10) Patent No.: US 9,317,365 B2
(45) Date of Patent: Apr. 19, 2016

(54) SOFT DECODING OF POLAR CODES

(71) Applicant: Seagate Technology LLC, Cupertino, CA (US)

(72) Inventors: AbdelHakim S. Alhussien, San Jose, CA (US); Erich F. Haratsch, San Jose (CA); Yue Li, College Station, TX (US)

(73) Assignee: Seagate Technology LLC, Cupertino, CA (US)

( * ) Notice: Subject to any disclaimer, the term of this patent is extended or adjusted under 35 U.S.C. 154(b) by 94 days.

(21) Appl. No.: 14/219,279

(22) Filed: Mar. 19, 2014

(65) Prior Publication Data

US 2015/0256196 A1 Sep. 10, 2015

Related U.S. Application Data

(60) Provisional application No. 61/948,777, filed on Mar. 6, 2014.

(51) Int. Cl.
| | |
|---|---|
| *G06F 11/10* | (2006.01) |
| *H03M 13/11* | (2006.01) |
| *H03M 13/13* | (2006.01) |
| *H03M 13/45* | (2006.01) |
| *H04L 1/00* | (2006.01) |

(52) U.S. Cl.
CPC ............ *G06F 11/1076* (2013.01); *H03M 13/13* (2013.01); *H03M 13/453* (2013.01); *H03M 13/1111* (2013.01); *H03M 13/1117* (2013.01); *H03M 13/45* (2013.01); *H04L 1/0054* (2013.01)

(58) Field of Classification Search
CPC ............ H03M 13/13; H03M 13/1111; H03M 13/1117; H03M 13/45; H03M 13/453; H04L 1/0054; G06F 11/1076
USPC ......................................................... 714/780
See application file for complete search history.

(56) References Cited

U.S. PATENT DOCUMENTS

| | | | | |
|---|---|---|---|---|
| 8,245,116 | B2 * | 8/2012 | Orlik | H03M 13/136 |
| | | | | 714/780 |
| 8,952,834 | B1 * | 2/2015 | Cronie | H03M 7/02 |
| | | | | 341/55 |
| 2012/0054576 | A1 * | 3/2012 | Gross | H03M 13/1117 |
| | | | | 714/752 |
| 2013/0117344 | A1 * | 5/2013 | Gross | G06F 17/10 |
| | | | | 708/490 |
| 2014/0019820 | A1 * | 1/2014 | Vardy | H03M 13/13 |
| | | | | 714/752 |
| 2014/0108748 | A1 * | 4/2014 | Lee | H03M 13/1111 |
| | | | | 711/154 |
| 2014/0208183 | A1 * | 7/2014 | Mahdavifar | H03M 13/296 |
| | | | | 714/755 |
| 2015/0092886 | A1 * | 4/2015 | Ionita | H04L 25/4917 |
| | | | | 375/298 |
| 2015/0103947 | A1 * | 4/2015 | Shen | H04B 1/04 |
| | | | | 375/295 |
| 2015/0194987 | A1 * | 7/2015 | Li | H04L 1/0057 |
| | | | | 714/752 |

(Continued)

OTHER PUBLICATIONS

E. Arikan, Channel Polarization: A Method of Constructing Capacity-Achieving Codes for Symmetric Binary-Input Memoryless Channels, IEEE Transactions on Inform. Theory, vol. 55, No. 7, pp. 3021-3073, Jul. 2009, New York, NY.
I. Tal, A. Vardy, List Decoding of Polar Codes, Information Theory Proc. IEEE Int'l Symp. on Information Theory (ISIT 2011), pp. 1-5, Jul. 2011, Saint Petersburg, Russia.

(Continued)

*Primary Examiner* — James C Kerveros
(74) *Attorney, Agent, or Firm* — Christopher P. Maiorana, PC

(57) ABSTRACT

An apparatus having a circuit and an interface to a nonvolatile memory is disclosed. The circuit is configured to (i) read a plurality of bits in a read channel of the nonvolatile memory. The bits are encoded with a polar code. The circuit is also configured to (ii) generate a plurality of probabilities based on a plurality of log likelihood ratio values of the read channel and (iii) decode the bits based on the probabilities.

20 Claims, 2 Drawing Sheets

(56) References Cited

U.S. PATENT DOCUMENTS

| | | | |
|---|---|---|---|
| 2015/0229337 A1* | 8/2015 | Alhussien | G06F 11/1072 714/773 |
| 2015/0293716 A1* | 10/2015 | Jiang | G06F 11/08 711/154 |

OTHER PUBLICATIONS

C. Leroux, A. J. Raymond, G. Sharkis, I. Tal, A. Vardy, W. J. Gross, Hardware Implementation of Successive Cancellation Decoders for Polar Codes, J. Signal Process. Syst., 69:305-315, Dec. 2012, New York, NY.

* cited by examiner

SOFT DECODING OF POLAR CODES

This application relates to U.S. Provisional Application No. 61/948,777, filed Mar. 6, 2014, which is hereby incorporated by reference in its entirety.

FIELD OF THE INVENTION

The invention relates to nonvolatile memory controllers generally and, more particularly, to a method and/or apparatus for implementing a soft decoding of polar codes.

BACKGROUND

Polar codes are a class of capacity-achieving codes with explicit construction. Polar codes can be decoded using different techniques. In flash memories, log likelihood ratio values are conventionally computed for memory cells by sensing flash channels with multiple reference thresholds. However, conventional polar decoders do not work using the log likelihood ratio values as direct input values.

SUMMARY

The invention concerns an apparatus having a circuit and an interface to a nonvolatile memory. The circuit is configured to (i) read a plurality of bits in a read channel of the nonvolatile memory. The bits are encoded with a polar code. The circuit is also configured to (ii) generate a plurality of probabilities based on a plurality of log likelihood ratio values of the read channel and (iii) decode the bits based on the probabilities.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
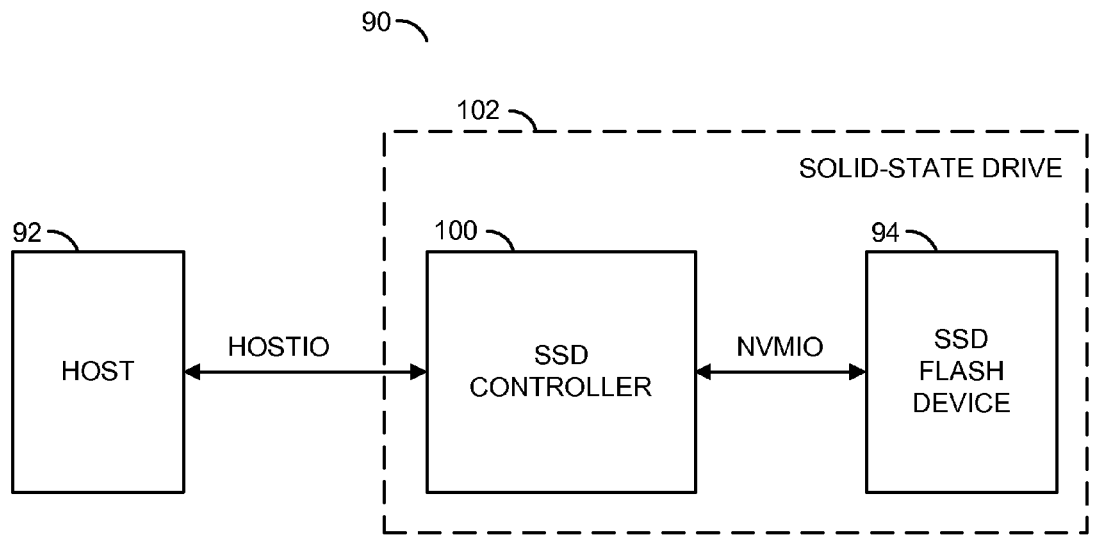
FIG. 1 is a diagram of an apparatus.

Embodiments of the invention include providing a soft decoding of polar codes that may (i) have a low complexity compared with conventional polar decoders, (ii) generate probabilities compatible with a soft polar decoding, (iii) modify the hard bits before the soft polar decoding, (iv) have two or more bits utilizing different nonvolatile memory channel models and/or (v) be implemented as one or more integrated circuits.

Polar codes are a class of capacity-achieving codes. Embodiments of the invention generally provide low complexity soft decoding techniques (or processes) of the polar codes with soft input manipulation integrated into hard decoding steps. The soft input values are log likelihood ratio values of a read channel in a nonvolatile memory (e.g., a flash memory) manipulated to be usable by the soft polar decoding techniques.

Integration of the log likelihood ratio values into a soft list decoding technique of polar codes involves multiple operations. The log likelihood ratio value for each bit is converted (or mapped) into a corresponding transition error probability that differs for each bit in a codeword, as the log likelihood ratio values also vary for each bit. A transition error between states (e.g., a logical one state or value and a logical zero state or value) is assumed to be symmetric. Large log likelihood ratio values correspond to small or zero transition error probabilities. On the other hand, when the log likelihood ratio value is erased for a bit (e.g., has a low or zero value), the error probability for that bit approaches 50 percent. In addition, the log likelihood ratio values are also hard sliced to obtain hard bit inputs to the soft list decoding techniques. Furthermore, the computed error transition probabilities are used as the channel error conditional probabilities in the soft list decoding technique iterative update equations.

Successive cancellation decoding techniques and soft list decoding technique, generally evaluate probabilities $W_N^{(i)}(y_1^N, \hat{u}_1^{i-1}|u_i)$. An estimated value of $\hat{u}^i$ of the i-th message bit $u_i$ is determined as follows: If $W_N^{(i)}(y_1^N, \hat{u}_1^{i-1}|u_i=0) > W_N^{(i)}(y_1^N, \hat{u}_1^{i-1}|u_i=1)$, the value of $u_i$ is 0, otherwise the value of $u_i$ is 1. The notations $y_1^N = (y_1, y_2, \ldots, y_N)$ and $\hat{u}_1^N = (\hat{u}_1, \hat{u}_2, \ldots, \hat{u}_N)$, where $y_i$ is a hard bit value. The evaluation of the probabilities $W_N^{(i)}$ generally use formulae 1 and 2 as follows:

$$W_{2N}^{(2i-1)}(y_1^{2N}, \hat{u}_1^{(2i-2)} | u_{(2i-1)}) = \sum_{u_{2i}} \frac{1}{2} W_N^{(i)}(y_1^N, \hat{u}_{1,o}^{(2i-2)} \oplus \hat{u}_{1,e}^{(2i-2)} | u_{(2i-1)} \oplus u_{2i}) \cdot W_N^{(i)}(y_{(N+1)}^{2N}, \hat{u}_{1,e}^{(2i-2)} | u_{2i}) \quad (1)$$

$$W_{2N}^{(2i)}(y_1^{2N}, \hat{u}_1^{(2i-1)} | u_{(2i)}) = \frac{1}{2} W_N^{(i)}(y_1^N, \hat{u}_{1,o}^{(2i-2)} \oplus \hat{u}_{1,e}^{(2i-2)} | u_{(2i-1)} \oplus u_{2i}) \cdot W_N^{(i)}(y_{(N+1)}^{2N}, \hat{u}_{1,e}^{(2i-2)} | u_{2i}) \quad (2)$$

The notations $\hat{u}_{1,o}^{(2i-2)} = (\hat{u}_1, \hat{u}_3, \hat{u}_5, \ldots, \hat{u}_{(2i-3)})$ and $\hat{u}_{1,e}^{(2i-2)} = (\hat{u}_2, \hat{u}_4, \hat{u}_6, \ldots, \hat{u}_{(2i-2)})$.

A list decoder process can be used to decode polar codes where multiple reads or direct soft output values are available from the nonvolatile memories or using the soft log likelihood ratio values at an output of sequence detectors in drives (e.g., solid-state drives and hard disk drives). The log likelihood ratio values may be computed by any method and effectively provide channel model estimates at each stored cell in the nonvolatile memories. The log likelihood ratio values are converted into corresponding channel error probabilities (e.g., cross-over probability values of a binary symmetric channel). The hard bits read from the nonvolatile memory are modified based on signs (e.g., positive or negative) of the log likelihood ratio values. As a result, the decoder has a low complexity and flexibility of list decoding as the update steps are modified to use the channel side information.

For a decoder using either the successive cancellation decoding technique or the list decoding technique, the step are modified to use the cross-over probabilities estimated from the log likelihood ratio values to a set of values of $W(x_1|y_1), W(x_2|y_2), \ldots, W(x_N|y_N)$, where $x_i$ (i=1, 2, . . . , N) are inputs to a channel and are known during the evaluation of the recurrence. A recurrence terminates at evaluating the probabilities $W(x_1|y_1), W(x_2|y_2), \ldots, W(x_N|y_N)$. Therefore, for i=1, 2, . . . , N, the probabilities are computer per formula 3 as follows:

$$W(x_i | y_i) = \begin{cases} \rho_i & \text{if } x_i \neq y_i \\ 1 - \rho_i & \text{otherwise} \end{cases} \quad (3)$$

The parameter $\rho$ is a transition error probability.

Simulation results suggest that a list successive cancellation decoding (or list decoding for short) generally provides a better decoding performance than a successive cancellation decoding. The list decoding is specified in genie channel error transition probabilities, in a probability domain and receives noisy codeword hard bits as input values. In various embodiments of the invention, the log likelihood ratio values are converted to corresponding channel transition error probabilities that are suitable as direct input values to the list decoding of the polar codes.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94 and a block (or circuit) 100. The circuits 94 and 100 form a drive (or device) 102. The circuits 92 to 102 may represent modules and/or blocks that may be implemented as hardware, software, a combination of hardware and software, or other implementations.

One or more signals (e.g., HOSTIO) are exchanged between the circuit 92 and the circuit 100. The host input/output signal HOSTIO generally includes, but is not limited to, a logical address component used to access data in the circuit 102, a host command component that controls the circuit 102, a write data component that transfers write data from the circuit 92 to the circuit 100 and a read data component that transfers error corrected read data from the circuit 100 to the circuit 92. One or more signals (e.g., NVMIO) are exchanged between the circuit 100 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries code protected write codewords written from the circuit 100 into the circuit 94 and a read codeword component that carries the coded codewords read from the circuit 94 to the circuit 100.

The circuit 92 is shown implemented as a host circuit. The circuit 92 is generally operational to read and write data to and from the circuit 94 via the circuit 100. When reading or writing, the circuit 92 transfers a logical address value in the signal HOSTIO to identify which set of data is to be written or to be read from the circuit 94. The address generally spans a logical address range of the circuit 102. The logical address may be address individual data units, such as SATA (e.g., serial-ATA) sectors.

The circuit 94 is shown implementing one or more nonvolatile memory circuits (or devices). According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., a physical address) in the signal NVMIO. The address generally spans a physical address range of the circuit 94.

In some embodiments, the circuit 94 may be implemented as a single-level cell (e.g., SLC) type circuit. A single-level cell type circuit generally stores a single bit per memory cell (e.g., a logical 0 or 1). In other embodiments, the circuit 94 may be implemented as a multi-level cell type circuit. A multi-level cell type circuit is capable of storing multiple (e.g., two) bits per memory cell (e.g., logical 00, 01, 10 or 11). In still other embodiments, the circuit 94 may implement a triple-level cell type circuit. A triple-level cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

Data within the circuit 94 is generally organized in a hierarchy of units. A block is a smallest quantum of erasing. A page is a smallest quantum of writing. A codeword (or read unit or Epage or ECC-page) is a smallest quantum of reading and error correction. Each block includes an integer number of pages. Each page includes an integer number of codewords.

The circuit 100 is shown implementing a controller circuit. The circuit 100 is generally operational to control reading to and writing from the circuit 94. The circuit 100 includes an ability to decode the read codewords received from the circuit 94. The resulting decoded data is presented to the circuit 92 via the signal HOSTIO and/or re-encoded and written back into the circuit 94 via the signal NVMIO. The circuit 100 comprises one or more integrated circuits (or chips or die) implementing the controller of one or more solid-state drives, embedded storage, or other suitable control applications.

As part of the decoding, the circuit 100 reads multiple bits of a codeword in a read channel of the circuit 94. The bits may be encoded with a polar code. The circuit 100 subsequently generates probabilities based on log likelihood ratio values of the read channel. The bits are decoded based on the probabilities. In various embodiments, the bits are modified by the log likelihood ratio values before being decoded.

The circuit 102 is shown implementing a solid-state drive. The circuit 102 is generally operational to store data generated by the circuit 92 and return the data to the circuit 92. According to various embodiments, the circuit 102 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 102 is generally operational to store data in a nonvolatile condition.

Figure 2:
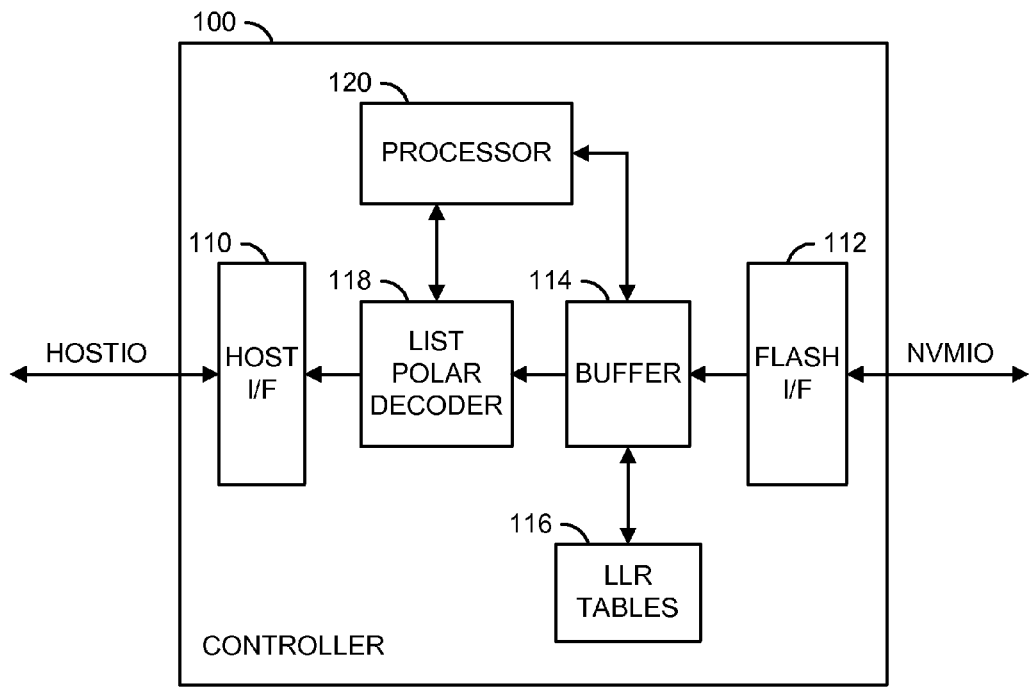
FIG. 2 is a diagram of a controller of the apparatus in accordance with an embodiment of the invention.

Referring to FIG. 2, a block diagram of an example implementation of the circuit 100 is shown in accordance with an embodiment of the invention. The circuit 100 generally comprises a block (or circuit) 110, a block (or circuit) 112, a block (or circuit) 114, a block (or circuit) 116, a block (or circuit) 118 and a block (or circuit) 120. The circuits 110 to 120 may represent modules and/or blocks that may be implemented as hardware, software, a combination of hardware and software, or other implementations.

The circuit 110 is shown implemented as a host interface circuit. The circuit 110 is operational to provide communication with the circuit 92 via the signal HOSTIO. Other signals may be implemented between the circuits 92 and 110 to meet the criteria of a particular application.

The circuit 112 is shown implemented as a nonvolatile memory (e.g., flash) interface circuit. The circuit 112 is operational to provide communication with the circuit 94 via the signal NVMIO. Other signals may be implemented between the circuits 94 and 110 to meet the criteria of a particular application.

The circuit 114 is shown implemented as a buffer circuit. The circuit 114 is operational to buffer codewords received from the circuit 94 via the circuit 112. The circuit 114 is also operational to buffer decoding parameters generated by the circuit 116. The read codewords and the decoding parameters are presented from the circuit 114 to the circuit 118.

The circuit 116 is shown implemented as a table circuit. The circuit 116 is operational to store and present decoding parameters (e.g., log likelihood ratio values and optionally the cross-over probability values) used in a soft-decision decoding performed by the circuit 118. The decoding parameters are presented by the circuit 116 to the circuit 114 for buffering and/or, in other embodiments, directly to circuit 118.

The circuit 118 is shown implemented as a list polar decoder circuit. In some embodiments, the circuit 118 is implemented as a successive cancellation decoder circuit. The circuit 118 is operational to perform both hard-decision (e.g., HD) decoding and soft-decision (e.g., SD) decoding of the codewords received from the circuit 114. The soft-decision decoding generally utilizes the decoding parameters presented by the circuit 116.

The circuit 120 is shown implemented as a processor circuit. The circuit 120 is operational to command and/or assist with the multiple read/write requests and to control one or more reference voltages used in the circuit 94 to read the codewords. In various embodiments, the circuit 120 is operational to generate the log likelihood ratio values of the read channels of the circuit 94. The log likelihood ratio values are generally stored in the circuit 116. The circuit 120 calculates the cross-over probability values based on the log likelihood ratio values. The cross-over probability values may be stored in the circuit 114, the circuit 116 and/or presented directly to the circuit 118. The circuit 120 is also operational to modify the hard bits of the codewords based on the log likelihood ratio values. The modified hard bits are buffered in the circuit 114.

Figure 3:
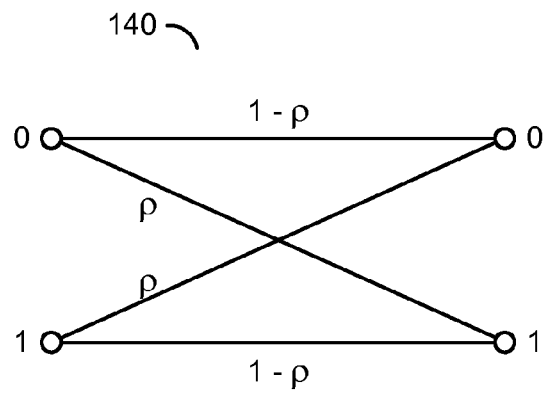
FIG. 3 is a diagram of a noise channel.

Referring to FIG. 3, a diagram of a noise channel 140 is shown. The bits of the codewords go through the noisy channels of the nonvolatile memories, which can be considered as a reliable binary symmetric channel (e.g., BSC) with the transition error probability ρ. The log likelihood ratio values (e.g., LLR) can be converted to the corresponding cross-over transition error probabilities ρ of the binary symmetric channel (e.g., BSC(ρ)) using formula 4 as follows:

$$\rho = (\exp(-|LLR|))/(1+\exp(-|LLR|)) \quad (4)$$

Where the magnitude (absolute value) of a log likelihood ratio value is large, the corresponding value of the transition error probability ρ generally approaches zero. Lower values of the transition error probability ρ generally mean that the corresponding binary symmetric channel is more reliable. Where the magnitude (absolute value) of a log likelihood ratio value approaches zero, the corresponding value of the transition error probability ρ approaches 0.5. The 0.5 value generally means that the corresponding binary symmetric channel is unreliable.

The decoding technique implemented in the circuit 118 generally receives the noisy channel hard bits as read from the circuit 94. Given a log likelihood ratio value, a corresponding hard bit value y is determined by formula 5 as follows:

$$y = \begin{cases} 1 & \text{if } LLR \geq 0 \\ 0 & \text{otherwise} \end{cases} \quad (5)$$

The modified hard bit has a logical one value where the corresponding log likelihood ratio value has a positive sign (e.g., LLR>0) or no sign (e.g., LLR=0). The modified hard bit has a logical zero value where the corresponding log likelihood ratio value has a negative sign (e.g., LLR<0).

Figure 4:
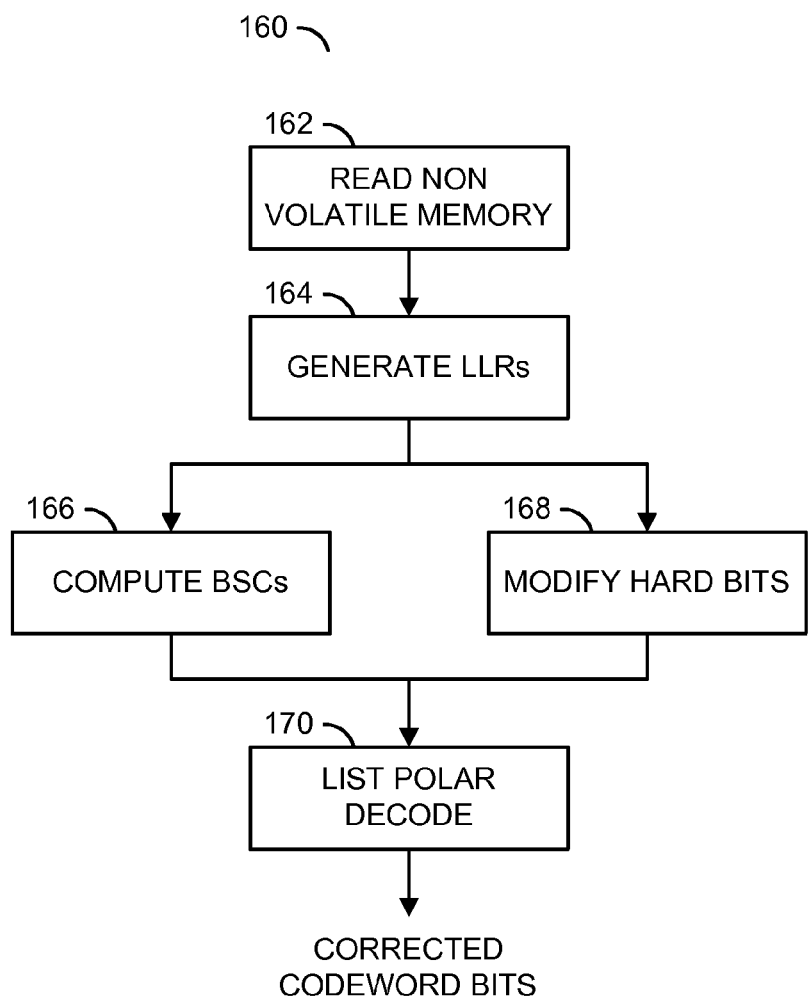
FIG. 4 is a diagram of a method for soft decoding a polar code.

Referring to FIG. 4, a flow diagram of an example method 160 for soft decoding a polar code is shown. The method (or process) 160 is implemented by the circuit 100. The method 160 generally comprises a step (or state) 162, a step (or state) 164, a step (or state) 166, a step (or state) 168, and a step (or state) 170. The steps 162 to 170 may represent modules and/or blocks that may be implemented as hardware, software, a combination of hardware and software, or other implementations. The sequence of the steps is shown as a representative example. Other step orders may be implemented to meet the criteria of a particular application.

Let a block length of the polar coded be N. In the step 162, an N-bit codeword is read from the circuit 94 by the circuit 100. In some embodiments, the reading includes reading at multiple reference voltages to provide sufficient data to the circuit 100 (e.g., the circuit 120) to calculate the log likelihood ratio values in the step 164. In various embodiments, the circuit 94 provides the soft information from the read channels to the circuit 100/120 such that the circuit 100/120 can calculate the log likelihood ratio values in the step 164. For the block length of N, N log likelihood ratio values (e.g., $LLR_1, LLR_2, \ldots, LLR_N$) are generated (or calculated).

In the step 166, the circuit 100/120 generates (or computes) the N transition error probabilities ρ of the binary symmetric channels (e.g., $\rho_1, \rho_2, \ldots, \rho_N$). The transition error probabilities ρ are calculated per formula 4. In parallel with, before, or after the step 166, the circuit 100/120 also generates (or modifies) the hard bits of the codeword in the step 168. The modified hard bits (e.g., $y_1, y_2, \ldots, y_N$) are modified per formula 5.

The circuit 118 generates corrected codeword bits in the step 170 by decoding the modified hard bits $y_1$ to $y_N$ based on the transition error probabilities $\rho_1$ to $\rho_N$. In various embodiments, the decoding is a list polar decoding. Other decoding techniques may be implemented to meet the criteria of a particular application.

The functions performed by the diagrams of FIGS. 1-4 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   an interface configured to process a plurality of read/write operations to/from a memory; and
   a control circuit configured to (i) read a plurality of bits in a read channel of the memory, wherein the plurality of bits are encoded with a polar code, (ii) generate a plurality of probabilities of transition errors between two possible states of the plurality of bits based on a plurality of log likelihood ratio values of the read channel of the memory and (iii) decode the plurality of bits based on the plurality of probabilities of transition errors.

2. The apparatus according to claim 1, wherein the control circuit is further configured to modify one or more bits of the plurality of bits based on the plurality of log likelihood ratio values prior to the plurality of bits being decoded.

3. The apparatus according to claim 2, wherein (i) a given bit of the plurality of bits is modified to a logical one value where a corresponding log likelihood ratio value of the plurality of log likelihood ratio values is greater than zero and (ii) the given bit is modified to a logical zero value where the corresponding log likelihood ratio value is less than zero.

4. The apparatus according to claim 1, wherein the plurality of probabilities of transition errors are of a binary symmetric channel.

5. The apparatus according to claim 1, wherein (i) a given probability of transition errors of the plurality of probabilities of transition errors is generated with a reliable value where a magnitude of a corresponding log likelihood ratio value of the plurality of log likelihood ratio values is large and (ii) the given probability of transition errors is generated with an unreliable value where the magnitude of the corresponding log likelihood ratio value is small.

6. The apparatus according to claim 1, wherein the plurality of bits are decoded using a list polar decoding.

7. The apparatus according to claim 1, wherein two or more bits of the plurality of bits have different channel models of the read channel of the memory.

8. The apparatus according to claim 1, wherein the memory is a flash memory.

9. The apparatus according to claim 1, wherein the interface and the control circuit are part of a solid-state drive controller.

10. A method for soft decoding of a polar code, comprising the steps of:
    reading a plurality of bits in a read channel of a memory, wherein the plurality of bits are encoded with the polar code;
    generating a plurality of probabilities of transition errors between two possible states of the plurality of bits based on a plurality of log likelihood ratio values of the read channel of the memory; and
    decoding the plurality of bits based on the plurality of probabilities of transition errors.

11. The method according to claim 10, further comprising the step of:
    modifying one or more bits of the plurality of bits based on the plurality of log likelihood ratio values prior to the plurality of bits being decoded.

12. The method according to claim 11, wherein (i) a given bit of the plurality of bits is modified to a logical one value where a corresponding log likelihood ratio value of the plurality of log likelihood ratio values is greater than zero and (ii) the given bit is modified to a logical zero value where the corresponding log likelihood ratio value is less than zero.

13. The method according to claim 10, wherein the plurality of probabilities of transition errors are of a binary symmetric channel.

14. The method according to claim 10, wherein (i) a given probability of transition errors of the plurality of probabilities of transition errors is generated with a reliable value where a magnitude of a corresponding log likelihood ratio value of the plurality of log likelihood ratio values is large and (ii) the given probability of transition errors is generated with an unreliable value where the magnitude of the corresponding log likelihood ratio value is small.

15. The method according to claim 10, wherein the plurality of bits are decoded using a list polar decoding.

16. The method according to claim 10, wherein two or more bits of the plurality of bits have different channel models of the read channel of the memory.

17. The method according to claim 10, wherein the memory is a flash memory.

18. The method according to claim 10, wherein the steps are performed in a solid-state drive controller.

19. An apparatus comprising:
a memory configured to store data; and
a controller configured to (i) process a plurality of input/output requests to read/write to/from the memory, (ii) read a plurality of bits in a read channel of the memory, wherein the plurality of bits are encoded with a polar code, (iii) generate a plurality of probabilities of transition errors between two possible states of the plurality of bits based on a plurality of log likelihood ratio values of the read channel of the memory and (iv) decode the plurality of bits based on the plurality of probabilities of transition errors.

20. The apparatus according to claim 19, wherein the memory and the controller are part of a solid-state drive.

* * * * *